United States Patent [19]

Clark

[11] Patent Number: 4,739,508

[45] Date of Patent: Apr. 19, 1988

[54] UNSTABLE RESONATOR DIODE LASER

[75] Inventor: George L. Clark, Manhattan Beach, Calif.

[73] Assignee: TRW Inc., Redondo Beach, Calif.

[21] Appl. No.: 730,526

[22] Filed: May 6, 1985

[51] Int. Cl.[4] .............................................. H01S 3/08
[52] U.S. Cl. ...................................... 372/95; 372/92; 372/98; 372/99; 372/44
[58] Field of Search ...................... 372/92, 95, 98, 99, 372/44, 49, 50, 43

[56] References Cited

U.S. PATENT DOCUMENTS 3,873,942  3/1975  Reilly ...................................... 372/95

OTHER PUBLICATIONS

Borghese et al., "Unstable-Stable Resonators with Toroidal Mirrors," Applied Optics, vol. 20, No. 20, 15 Oct. 1981, pp. 3547-3552.
Bogatov et al., "Injection Laser with An Unstable Resonator," Sov. J. Quantum Electron, 10(5), May 1980, pp. 620–622.

*Primary Examiner*—James W. Davie
*Assistant Examiner*—Gerogia Y. Epps
*Attorney, Agent, or Firm*—Noel F. Heal; Thomas N. Giaccherini

[57] ABSTRACT

A diode laser having an acitve layer bounded by confinement layers and two end facets that include etched mirrors selected to form an unstable resonator with good transverse mode quality. Energy from the unstable resonator is coupled out of the device through a transmissive window in one of the facets, the window providing a relatively large flux area and permitting higher output powers without loss of mode quality. Since stripe geometry is not used to control mode quality, a large current-carrying area is available, which reduces the current density and also permits higher output powers and longer operating lives.

7 Claims, 1 Drawing Sheet

UNSTABLE RESONATOR DIODE LASER

BACKGROUND OF THE INVENTION

This invention relates generally to semiconductor diode lasers, and more particularly, to semiconductor diode lasers capable of operating at relatively high power levels. The basic structure of a p-n junction laser includes an active layer at the junction between a layer of p-type material on one side and a layer of n-type material on the other. A pair of parallel planes are cleaved or polished perpendicular to the plane of the junction, and the remaining sides of the diode structure are roughened to eliminate lasing in directions other than the intended one. This structure is called a Fabry-Perot cavity. If an increasing forward bias is applied to the laser diode, a current flows. Initially, at low currents, there is spontaneous emission of light in all directions. As the basis is increased, eventually a threshold current is reached at which stimulated emission occurs and a monochromatic beam of light is emitted from the junction. The beam is highly directional within the plane of the junction.

One of the most common forms of diode laser structure is called the double heterostructure. It has a semiconductor material of a relatively higher bandgap on each side of the active layer. These surrounding materials provide both an energy barrier to confine current carriers, and an optical barrier in the form of an abrupt reduction in refractive index outside the active layer.

Typically, semiconductor laser diodes are deliberately limited in their dimensions perpendicular to the axis along which light is emitted. First, the thickness of the active layer is kept small in order to keep the threshold current low. There is no known way of increasing the thickness of the active layer, which is the laser gain region, without giving up the high efficiency and low current threshold of the double heterostructure design. In the other transverse direction, in the plane of the junction but perpendicular to the direction of light output, this dimension of the gain region is kept small to force the laser to oscillate in only the lowest order transverse mode. In practice, this transverse dimension is controlled by the width of an electrode stripe on the surface of the structure, or of a narrow region of the structure doped with a material such as zinc, or by other means.

Lasers having their active regions constricted in both transverse directions are referred to as double-heterostructure stripe-geometry lasers. Since the restricted transverse dimensions define the cross-sectional area of light emission from the laser, for a given laser power the optical flux density at the facets of the structure will be increased by restricting the transverse dimensions. In addition, the narrow stripe geometry of the device results in a relatively high current density through the active region. It is well known that both the power output and the lifetime of semiconductor lasers are limited by the optical flux density and the current density through the active region. In other words, although the power output can be increased by increasing the optical flux density or increasing the current density, the lifetime of the device will be reduced as a result. Minimization of the transverse dimensions is limited by a damage threshold for the optical flux density, above which the device will be subject to serious damage. For this reason, the small light-emitting area of double heterojunction stripe-geometry lasers, which is typically about one square micron ($1 \times 10^{-6}$ meter), can support a laser power of only a few milliwatts. More desirable power levels of 50-100 milliwatts (mW) can be achieved only by either widening the electrode stripe or thickening the active region. However, widening the stripe results in loss of mode control, and thickening of the active region results in an increased threshold current.

Although no solution to this problem is known, other than the invention to be described, one researcher has experimented with injection lasers in which one end face is cleaved and the other is ground to a cylindrical curvature. This was reported by A. P. Bogatov et al., Soviet Journal of Quantum Electronics, Vol. 10, pp. 620–22 (1980).

It will be appreciated from the foregoing that there is a need for a semiconductor laser structure that will overcome these disadvantages. In particular, what is needed is a semiconductor diode laser structure that is capable of operation at higher power levels, but without sacrificing mode control or a desirably low threshold current. The present invention satisfies this need.

SUMMARY OF THE INVENTION

The present invention resides in a semiconductor diode laser in which there is no severe transverse dimensional restriction parallel to the junction, and lasing takes place in an unstable resonator instead of a plane-parallel one. Abandonment of the stripe geometry would ordinarily result in a tendency for the laser to oscillate in many transverses modes, but this tendency is overcome by changing the optical resonator of the structure from a plane-parallel resonator, which affords no mode selection, to an unstable one, which has been shown to have excellent mode control. Moreover, in the structure of the invention, this change in resonator type is effected without the use of external mirrors.

Briefly, and in general terms, the structure of the invention includes a conventional semiconductor double heterostructure, including a generally planar active layer, across which a forward bias voltage is applied, and first and second facets, having reflective portions of which at least one is curved, to form an unstable resonator with the other. In the illustrative embodiment of the invention, the first facet is curved to present a concave reflective surface toward the active layer, and the second facet includes a curved portion presenting a convex reflective surface toward the active layer and a planar portion that is non-reflective, the curvatures of the two curved surfaces being selected to form the unstable resonator, from which energy is coupled out of the structure through the planar portion of the second facet.

In one preferred embodiment of the invention, the two curved surfaces are cylindrical. As multiple reflections occur between the two cylindrical surfaces, oscillation builds up along an optical axis of the two surfaces, which lies at or near one edge of the active layer. Light rays traced back and forth between the curved surfaces follow paths that eventually no longer impinge on the convexly curved surface of the second facet, and emerge from the structure through the planar portion of the second facet. If the cylindrical surfaces are confocal, i.e. have a common center of curvature, the light will emerge from the structure as a parallel beam in the plane of the junction. The output coupling fraction from the resonator is determined by the ratio of the radii of curvature of the two surfaces, and should be selected to be consistent with the gain and losses of the active region of the device.

The principal advantage of the invention is that the area available for output flux, the area available for current through the junction, and the volume of the gain region, are all increased by a large factor. Stripe-geometry lasers restrict the transverse dimension to 3–5 microns, but the structure of the invention allows the corresponding dimension to be as high as 300–500 microns. Another advantage is that high-reflectivity coatings on the curved surfaces protect the facets, both by preventing oxidation of the surfaces and by keeping the electric vector smaller than it would otherwise be without a coating. As is well known, a highly reflective or highly transmissive surface is less susceptible to optical flux damage than one that is intermediate in reflectivity.

It will be appreciated that the invention represents a significant advance in the field of semiconductor diode lasers. In particular, although the invention retains the advantages of the double-heterostructure stripe-geometry laser, it also increases the emitting area and the current-conducting area of the active layer. The maximum power output is increased, both as a result of the increased current-conducting area and increased emitting area, and also as a result of an increase in allowable flux density through the facets. Other aspects and advantages of the invention will become apparent from the following more detailed description, taken in conjunction with the accompanying drawings.

DESCRIPTION OF THE PREFERRED EMBODIMENT

Figure 1:
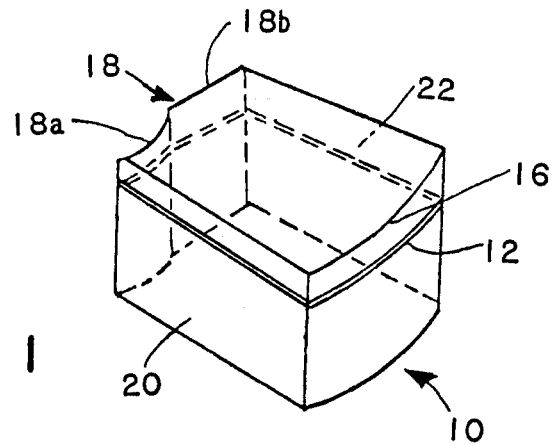
FIG. 1 is a simplified perspective view of a semiconductor diode laser embodying the present invention.

As shown in the drawings for purposes of illustration, the present invention is concerned with an improved semiconductor diode laser. Conventional double-heterostructure lasers are usually fabricated with an active layer made as thin as possible, to minimize the threshold current above which lasing begins, and a narrow gain region defined by a stripe electrode or other means, to minimize lasing in other than a desired transverse mode. Unfortunately, these minimized transverse dimensions place a severe limitation on the maximum power output of the laser. Prior to this invention, it appeared that high power output could be obtained only at the expense of loss of mode control and a decrease in device lifetime.

In accordance with the invention, a double-heterostructure laser includes curved and highly reflective end facets, the curvatures of which are selected to provide a high-loss, unstable resonator, which has excellent mode stability, and an emitting area of much greater cross-sectional area than that of the conventional semiconductor laser.

More specifically, and as shown in FIG. 1, the structure of the invention, indicated generally by reference numeral 10, includes an active layer 12 embedded in the structure. Basically, the structure forms a p-n semiconductor junction at the active layer 12, and when the junction is forward-biased to a sufficient voltage level, a threshold is exceeded and a lasing action takes place within the active layer. In a conventional semiconductor laser, two parallel faces of the structure are cleaved to provide opposed mirrors for the lasing action, and the other faces are roughened to inhibit lasing in all but a desired direction.

Figure 2:
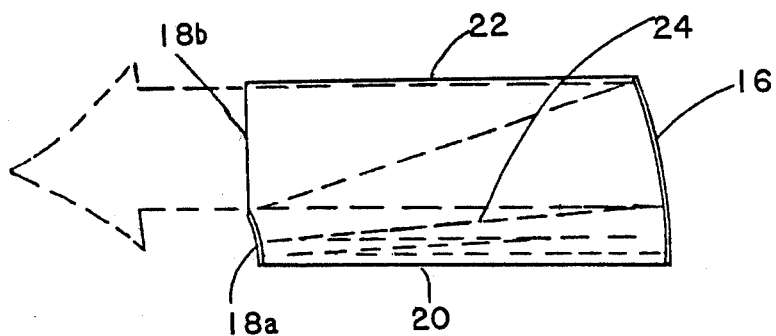
FIG. 2 is a simplified plan view of the device of FIG. 1, showing typical internal ray paths.

In the structure of the invention, a first facet 16 is formed by etching to define a cylindrical surface and to present a concave curvature toward the active layer. The first facet 16 is coated with a highly reflective material. The opposite second facet, indicated at 18, has a curved portion 18a presenting a convex face toward the active layer, and an adjoining planar portion 18b. The other two faces 20 and 22 of the structure, as viewed in the plan view of FIG. 2 are parallel with each other, and the planar portion 18b of the second facet is substantially perpendicular to the two parallel faces. The surface of the curved portion 18a is also coated with a reflective material.

When a threshold current is passed through the active layer 12, lasing takes place in the gain region between the two curved reflective surfaces 16 and 18a. Oscillation builds up along an optical axis of the two surfaces, which lies at or near the face 20. Repeated reflections occur between the curved surfaces 16 and 18a, and the rays 24 "walk" away from the face 20 and toward the opposite face 22, eventually emerging through the planar portion 18b. A portion of the energy from the gain region of the laser is coupled out of the structure through the face 18b, which is coated with an anti-reflective material. If the curved surfaces 16 and 18a are cylindrical and confocal, i.e. have a common center of curvature, the light will emerge as a parallel beam in the plane of the junction. The output coupling fraction, i.e., the fraction of energy coupled out of the structure is determined by the ratio of the radii of curvature of the two surfaces 16 and 18a. This ratio must be selected to be consistent with the gain achieved in the gain region, and the associated losses in the region. The structure of the invention works very much like an oscillator-amplifier combination. The region near the cylindrical axis serves as an oscillator, and the outer portion functions as an amplifier.

There are a number of advantages to the structure of the invention. First, the area available for output flux is greatly increased. Instead of a stripe width of 3–5 micrometers, the corresponding transverse dimension can be hundreds of micrometers. For the same reason, the area available for current through the junction is increased. By being able to operate at a higher current and a higher output flux, the device can operate at higher powers without approaching the damage threshold. Another advantage is that the uses of reflective and anti-reflective coatings protects the facets of the structure to some degree, since surfaces that are highly reflective or highly transmissive are less susceptible to optical flux damage. Accordingly, a higher flux density, and a correspondingly higher output power can be tolerated without damage.

Figure 3:
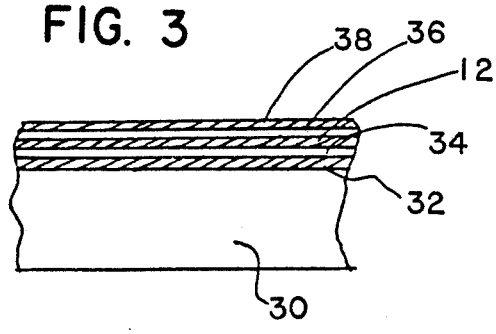
FIG. 3 is a fragmentary cross-sectional view of the device of FIG. 1, showing a typical double-heterostructure.

FIG. 3 shows a typical cross-section of the device. The double-heterostructure waver is grown on a substrate 30 of (100)-oriented n-doped gallium arsenide (GaAs) material, by a process of metal-organic chemical vapor deposition (MOCVD). The structure includes a one-micrometer n-type GaAs buffer layer 32, a 1.2-micrometer n-type gallium aluminum arsenide (GaAlAs) confinement layer 34, the active layer 12 of 700 A (Angstroms) thickness, a 1.2-micrometer p-type GaAlAs confinement layer 36, and a 0.5-micrometer p-type GaAs cap layer 38.

The curved surfaces 16 and 18b are formed by wet chemical etching through a photoresist mask (not shown). A suitable etchant is a stirred solution of sulfuric acid, hydrogen peroxide and water. Lasers of this structure have been constructed with various radii of curvature from 50 micrometers to an infinite radius, i.e. planar mirrors. The devices were approximately 300 micrometers long and 250 micrometers wide. The lasers were tested with a pump pulse duration of 100 nanoseconds and a repetition frequency of 500 Hz (hertz). Threshold currents of about 1.4 amperes were observed to be independent of mirror radius, corresponding to a current density of about 1,800 amps/cm$^2$. Output power levels of up to 10 mw (milliwatts) were routinely achieved.

With plane parallel resonator mirrors, the near-field light distribution pattern of the device appears as one or more randomly positioned filaments of about 10 micrometers in width. As the radii of curvature of the resonator mirrors are decreased, the transverse mode structure stabilizes and the near-field pattern evolves into a uniform bright band. Various combinations of resonator mirror radii can be employed to achieve the desired single transverse mode of operation. For example, both mirrors may be curved, as in the illustrative embodiment, or satisfactory operation may be obtained with only one curved mirror and one flat mirror. Although the output beam from the latter arrangement will not be parallel, a suitable collimating lens may be added if desired. As the transverse mode structure is stabilized by the use of curved resonator mirrors, the longitudinal mode spectrum is also narrowed as the radii of mirror curvature are decreased. In the experimental structures, single-mode operation was always obtained with radii of around 50 micrometers, but was seldom obtained when the radii were increased above 200 micrometers.

It will be appreciated from the foregoing that the present invention represents a significant advance in the field of semiconductor diode lasers. In particular, the device of the invention provides higher power output and better mode quality than is possible with conventional plane-parallel Fabry-Perot diode resonators. It will also be appreciated that, although a specific embodiment of the invention has been described in detail for purposes of illustration, various modifications may be made without departing from the spirit and scope of the invention. Accordingly, the invention is not to be limited except as by the appended claims.

I claim:

1. In a semiconductor diode laser, a structure comprising:
    a generally planar active layer, across which a forward bias voltage is applied, cladding layers adjacent to the active layer, to confine light in a direction perpendicular to the active layer, and first and second facets;
    in which the first facet is curved to present a concave part-cylindrical reflective surface toward the active layer, and in which the second facet includes a curved portion presenting a convex part-cylindrical reflective surface toward the active layer and a planar portion that is non-reflective, the curvatures of the two curved surfaces having axes of curvature that are approximately perpendicular to the active layer, the curvatures being selected to form an unstable resonator, in which light is confined in a particular sense by the cladding layers, and from which energy is out-coupled through the planar portion of the second facet.

2. A semiconductor diode laser as set forth in claim 1, in which:
    the concave and convex reflective surfaces are part-cylindrical in shape.

3. A structure as set forth in claim 1, in which:
    the concave and convex reflective surfaces have a common axis of curvature 4. In a semiconductor diode laser, a structure comprising:
    a generally planar active layer, across which a forward bias voltage is applied, cladding layers adjacent to the active layer, to confine light in a direction perpendicular to the active layer, and first and second facets;
    in which the first facet presents a highly reflective surface to the active layer, the second facet has a portion of its area that presents a highly reflective surface toward the active layer and an adjoining portion that is highly transmissive, and at least one of the highly reflective surfaces is curved cylindrically to form an unstable resonator with the other in the plane of the active layer, the curved surface having an axis of curvature that is approximately perpendicular to the active layer;
    and in which a portion of the energy from the resonator is coupled out of the device through the transmissive portion of the second facet.

5. A structure as set forth in claim 4, in which:
    both reflective surfaces are curved cylindrically, the first facet presenting a concave curvature toward the active layer and the reflective portion of the second facet presenting a convex curvature toward the active layer.

6. A semiconductor diode laser as set forth in claim 5, in which:
    the two curved surfaces are part-cylindrical in shape.

7. A structure as set forth in claim 6, in which:
    the two reflective surfaces have a common axis of curvature.

* * * * *